United States Patent [19]

Saeki et al.

[11] Patent Number: 5,219,775
[45] Date of Patent: Jun. 15, 1993

[54] MANUFACTURING METHOD FOR A FLOATING GATE SEMICONDUCTOR MEMORY DEVICE BY FORMING CELL SLITS

[75] Inventors: Yukihiro Saeki, Yokohama; Osamu Matsumoto, Kawasaki; Masayuki Yoshida, Kawasaki; Takahide Mizutani, Kawasaki; Nobuyoshi Chida, Kawasaki; Tomohisa Shigematsu, Yokohama; Teruo Uemura, Yokohama; Kenji Toyoda, Yokohama; Hiroyuki Takamura, Yokohama, all of Japan

[73] Assignee: Kabushiki Kaisha Toshiba, Kawasaki, Japan

[21] Appl. No.: 836,592

[22] Filed: Feb. 18, 1992

[30] Foreign Application Priority Data

Feb. 18, 1991 [JP] Japan .................. 3-108963

[51] Int. Cl.$^5$ ........................................ H01L 21/266
[52] U.S. Cl. ........................................ 437/43; 437/49; 148/DIG. 106
[58] Field of Search ............... 437/43, 49, 193, 195, 437/233, 983; 148/DIG. 106, DIG. 51, DIG. 131; 357/23.5; 365/185

[56] References Cited

U.S. PATENT DOCUMENTS

| 4,317,273 | 3/1982 | Guterman et al. ............ 437/43 |
| 4,720,323 | 1/1988 | Sato .......................... 437/43 |
| 4,852,062 | 7/1989 | Baker et al. .................. 437/43 |
| 4,957,877 | 9/1990 | Tam et al. .................... 437/43 |

FOREIGN PATENT DOCUMENTS

| 0187278A3 | 7/1986 | European Pat. Off. . |
| 0206929A1 | 12/1986 | European Pat. Off. . |
| 0395084A2 | 10/1990 | European Pat. Off. . |
| 59126675A | 11/1987 | Japan . |
| 2080024A | 1/1982 | United Kingdom . |

Primary Examiner—Brian E. Hearn
Assistant Examiner—C. Chaudhari
Attorney, Agent, or Firm—Finnegan, Henderson, Farabow, Garrett & Dunner

[57] ABSTRACT

A manufacturing method of a semiconductor memory device includes the steps of selectively forming a field oxide film and a gate oxide film on a semiconductor substrate, depositing a first conductive layer on an entire surface of the resultant structure, selectively etching the first conductive layer located in a region other than an element region, depositing a second conductive layer on an entire surface of the resultant structure, and etching the first conductive layer and the second conductive layer using the same mask to form a plurality of floating gates by the first conductive layer and to form a plurality of control gates by the second conductive layer, wherein the step of selectively etching the first conductive layer includes the first etching step of forming cell slits for separating the plurality of floating gates from each other and the second etching step of forming removed regions each of which includes only one end of each of the plurality of control gates.

7 Claims, 11 Drawing Sheets

MANUFACTURING METHOD FOR A FLOATING GATE SEMICONDUCTOR MEMORY DEVICE BY FORMING CELL SLITS

BACKGROUND OF THE INVENTION

1. Field of the Invention

The present invention relates to a method of manufacturing a semiconductor integrated circuit in which a floating gate and a control gate of a MOS transistor are formed using two conductive layers, e.g., polysilicon layers.

2. Description of the Related Art

In the field of semiconductor integrated circuits, some elements can electrically update data and store data without supplying a power source voltage to the elements. Such an element is called a non-volatile memory element. As a semiconductor integrated circuit in which the non-volatile memory element is arranged as a memory cell, an EPROM (Erasable and Programmable ROM), an E²PROM (Electrically Erasable and Programmable ROM), or the like is known. In the non-volatile memory element arranged in the EPROM or E²PROM, a floating gate constituted by a first polysilicon layer for storing data and a control gate constituted by a second polysilicon layer used for controlling writing and reading operations are generally formed.

Steps in manufacturing a memory cell constituted by the above non-volatile memory element will be briefly described below.

(1) A relatively thin gate oxide film is formed in an element region on a semiconductor substrate, and a relatively thick field oxide film is formed in a region other than the element region.

(2) A first polysilicon layer is deposited, and this polysilicon layer is selectively etched. At this time, an etched region is generally called a cell slit.

(3) The first polysilicon layer in a region other than a cell region is selectively etched. This step may be performed simultaneously with the etching step (2) for the cell slit.

(4) After the entire surface of the resultant structure is oxidized, a second polysilicon layer is deposited thereon.

(5) The second polysilicon layer, the oxide film, and the first polysilicon layer in the cell region are selectively etched.

(6) The second polysilicon layer in the region other than the cell region is selectively etched.

(7) Ion implantation is performed to form the source/drain of a MOS transistor for a memory cell.

(8) Contact holes are formed.

(9) A wiring metal layer is formed.

With the above steps, a large number of memory cells each having a two-layered polysilicon structure including a floating gate formed by the first polysilicon layer and a control gate formed by the second polysilicon layer are formed. In addition, the control gate of each of the memory cells also serves as a word line.

In a large number of memory cells manufactured in the above steps, in order to supply an output from a plurality of row decoders to word lines which also serve as control gates, contact holes are formed at the end portion of each of the word lines and at the position of each of the output nodes of the row decoder, and both the contact holes must be connected to each other using a metal wiring line or the like. Since the output nodes of the row decoder are generally formed by a diffusion layer and the control gates are formed by the second polysilicon layer, a signal path must be formed beginning with the diffusion layer first, followed by the contact hole, the metal wiring line, the contact hole, and the second polysilicon layer.

In this case, when a contact hole is to be formed in the second polysilicon layer, the following aspects of the process are important. That is, a contact hole in the diffusion layer and a contact hole in the second polysilicon layer are simultaneously formed. In a photoetching process, a focal depth for a photoresist is important. If the second polysilicon is located on the first polysilicon layer and the oxide film formed thereon, and contact holes are to be formed in the second polysilicon layer, the focal depths for the contact holes formed in the diffusion layer and the second polysilicon layer do not easily have the same condition due to the positional relationship between the diffusion layer and the second polysilicon layer.

FIG. 1 is a plan view of a pattern showing a structure near an output node of a row decoder and an end portion of a word line. FIGS. 2A and 2B are sectional views of different structures along a line 2—2a in FIG. 1. In FIGS. 2A and 2B, reference numeral 60 denotes a semiconductor substrate; 61, a diffusion layer serving as an output node of a row decoder; 62, a first polysilicon layer; 63, a second polysilicon layer; 64, an insulating oxide film; 65 and 66, contact holes formed in the insulating oxide film 64.

As shown in FIG. 2A, when the second polysilicon layer 63 is left on the first polysilicon layer 62, and a beam is focused on the contact hole 66 in the second polysilicon layer 63, the beam is not focused on the contact hole 65 on the diffusion layer 61 because the hole 65 is located at a position much deeper than that of the contact hole 66. For this reason, both the contact holes 65 and 66 are not simultaneously formed, and they must be independently formed in different steps, thereby complicating the steps in manufacturing an integrated circuit.

As a method for solving the above problem, as shown in FIG. 2B, there is a method in which the first polysilicon layer 62 located under the second polysilicon layer 63 is removed in advance. This removal is performed simultaneously with step (3). According to this method, the height of the contact hole 66 on the second polysilicon layer 63 is close to that of the contact hole 65 on the diffusion layer 61, and the contact hole 65 on the diffusion layer 61 and the contact hole 66 on the second polysilicon layer 63 can be simultaneously formed.

FIG. 3 is a plan view of a pattern showing an arrangement of a part of the memory cell array of an EPROM formed in the latter method shown in FIG. 2B, and FIG. 4 is a sectional view showing the memory cell array along a line 4—4a in FIG. 3. In FIGS. 3 and 4, reference numeral 71 denotes a diffusion layer serving as the source or drain of a memory cell transistor; 72, floating gates constituted by a first polysilicon layer; 73, word lines constituted by a second polysilicon layer and serving as a plurality of control gates; 74, cell slits for separating the first polysilicon layer into the floating gates; 75, a removed region from which the first polysilicon layer is removed in advance; and 76, contact holes for connecting bit lines (not shown) to the drains of memory cell transistors.

As shown in FIG. 3, in a conventional method, the removed region 75 of the first polysilicon layer is formed to have large region including the plurality of word lines 73.

As described above, in the conventional method, since the removed region is formed to have the large region including the plurality of word lines, the following inconvenience occurs.

FIGS. 5A to 5E are sectional views sequentially showing the steps of depositing the first and second polysilicon layers, selectively etching these layers, and forming the floating gate and the control gate.

As shown in FIG. 5A, the first polysilicon layer 62 is deposited. As shown in FIG. 5B, a part of the first polysilicon layer 62 is selectively removed to form a removed region 75. At this time, a step difference corresponding to the thickness of the first polysilicon layer 62 is formed at an interface between the first polysilicon layer 62 and the removed region 75. As shown in FIG. 5C, after a gate oxide film 67 is formed, the second polysilicon layer 63 is deposited on the entire surface of the resultant structure. At this time, the step difference corresponding to the thickness of the first polysilicon layer 62 is left. Subsequently, as shown in FIG. 5D, the second polysilicon layer 63, the gate oxide film 67, and the first polysilicon layer 62 are selectively removed by etching in this order. At this time, the second polysilicon layer 63 may not be completely etched such that a part of the second polysilicon layer 63 is often left on a side wall of the gate oxide film 67. Subsequently, as shown in FIG. 5E, the first polysilicon layer 62 on a portion other than a memory cell transistor is selectively removed. At this time, the part of the second polysilicon layer 63 which is left in the etching step is left.

FIG. 6 is a perspective view showing the state at a time when the step of FIG. 5E is finished. As shown in FIG. 5E, if part of the second polysilicon layer 63 remains after the etching step, the word lines 73 are short-circuited with each other by this part of the second polysilicon layer 63.

According to the above conventional method, a first conductive layer is deposited, a part of the first conductive layer is removed, and a second conductive layer is formed thereon. Thereafter, when the second and first conductive layers are selectively removed in sequence, a part of the second conductive layer to be removed is left, the regions of the second conductive layer which must be formed separately from each other in a normal state are disadvantageously short-circuited with each other.

SUMMARY OF THE INVENTION

The present invention has been made in consideration of the above circumstances, and has as its object to provide a method of manufacturing a semiconductor integrated circuit capable of preventing the drawback in which second conductive layer regions to be formed separately from each other in a normal state are short-circuited with each other.

According to an aspect of the present invention, there is provided a method of manufacturing a semiconductor memory device, comprising the steps of:

selectively forming a field oxide film and a gate oxide film on a semiconductor substrate;

depositing a first conductive layer on an entire surface of the resultant structure;

selectively etching the first conductive layer located in a region other than an element region;

depositing a second conductive layer on an entire surface of the resultant structure; and.

etching the first conductive layer and the second conductive layer using the same mask to form a plurality of floating gates by the first conductive layer and to form a plurality of control gates by the second conductive layer;

wherein the step of selectively etching the first conductive layer includes the first etching step of removing cell slits for separating the plurality of floating gates from each other and the second etching step of forming removed regions each of which includes only one end of each of the plurality of control gates.

According to the present invention, when the regions each of which includes only one end of each of the plurality of control gates are etched, even when a part of the second conductive layer is left on a side wall of the first conductive layer in the step of etching the second conductive layer, this part does not short-circuit the control gates.

According to another aspect of the present invention, there is provided a method of manufacturing a semiconductor memory device, comprising the steps of:

selectively forming a field oxide film and a gate oxide film on a semiconductor substrate;

depositing a first conductive layer on an entire surface of the resultant structure;

selectively etching the first conductive layer located in a region other than an element region;

depositing a second conductive layer on an entire surface of the resultant structure; and etching the first conductive layer and the second conductive layer using the same mask to form a plurality of floating gates by the first conductive layer and to form a plurality of control gates by the second conductive layer;

wherein the step of selectively etching the first conductive layer includes the first etching step of forming cell slits for separating the plurality of floating gates from each other and the second etching step of forming removed regions each of which includes only one end of each of the plurality of control gates, and the first and second etching steps are performed using different etching methods.

According to the present invention, the second etching step of etching the regions each of which includes one end of each of the plurality of control gates is performed by an isotropic etching method. Therefore, the sectional shape of the first conductive layer becomes trapezoidal in the step of etching the first conductive layer. Thereafter, in the step of selectively etching the second conductive layer, the second conductive layer can be etched not to be left on the side wall of the first conductive layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments will be described below with reference to the accompanying drawings.

Figure 7:
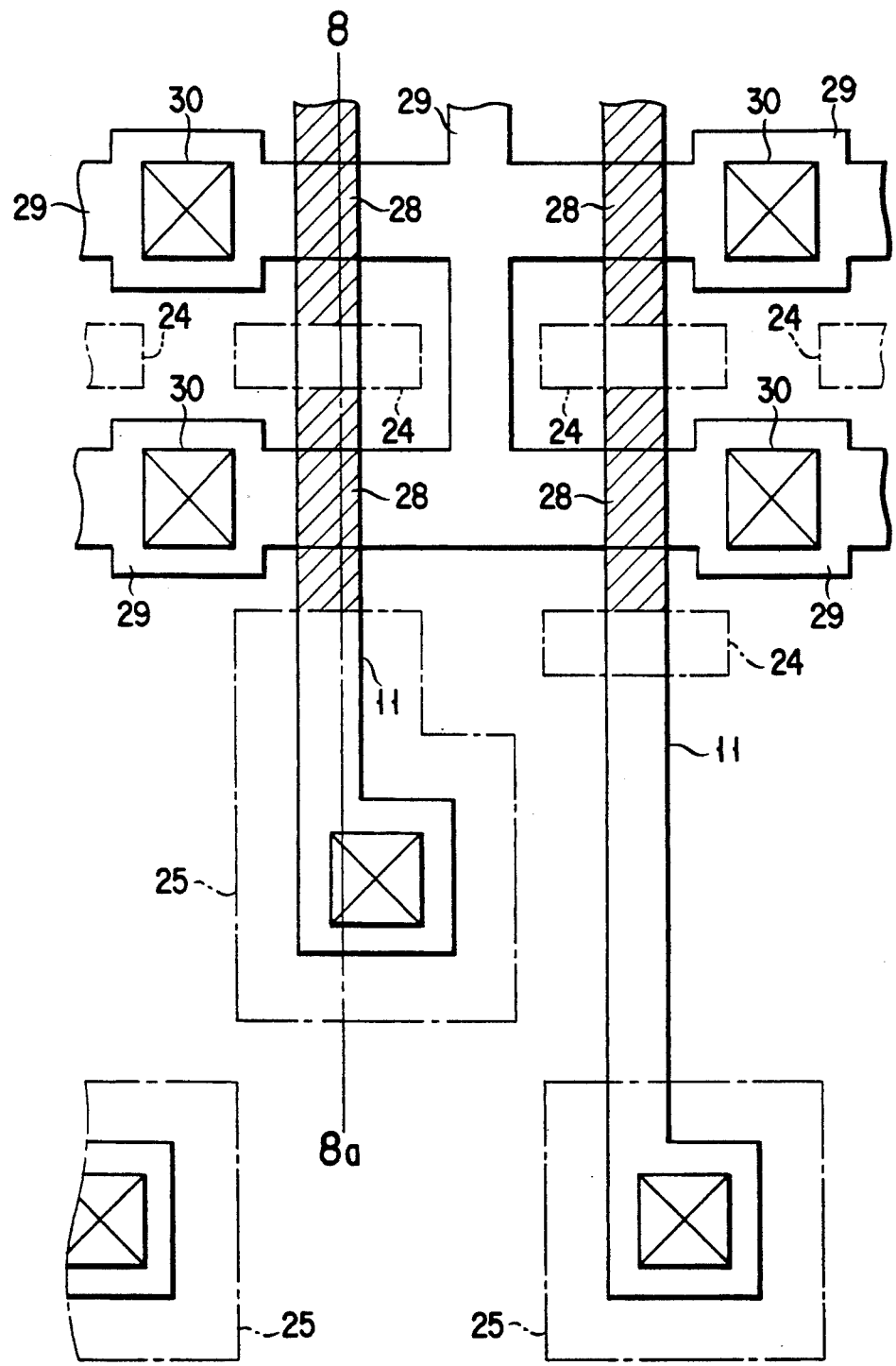
FIG. 7 is a plan view of a pattern showing a part of a memory cell array of an EPROM manufactured by a method according to an embodiment of the present invention.

FIG. 7 is a plan view of a pattern showing a part of a memory cell array of an EPROM manufactured by a method according to an embodiment of the present invention, and FIGS. 8A to 8E are sectional views showing sectional structures of a part of the memory cell array along a line 8—8a in FIG. 7 in order in which they are manufactured. In this embodiment, an EPROM having the memory cell array shown in the circuit diagram of FIG. 9 is manufactured.

Figure 9:
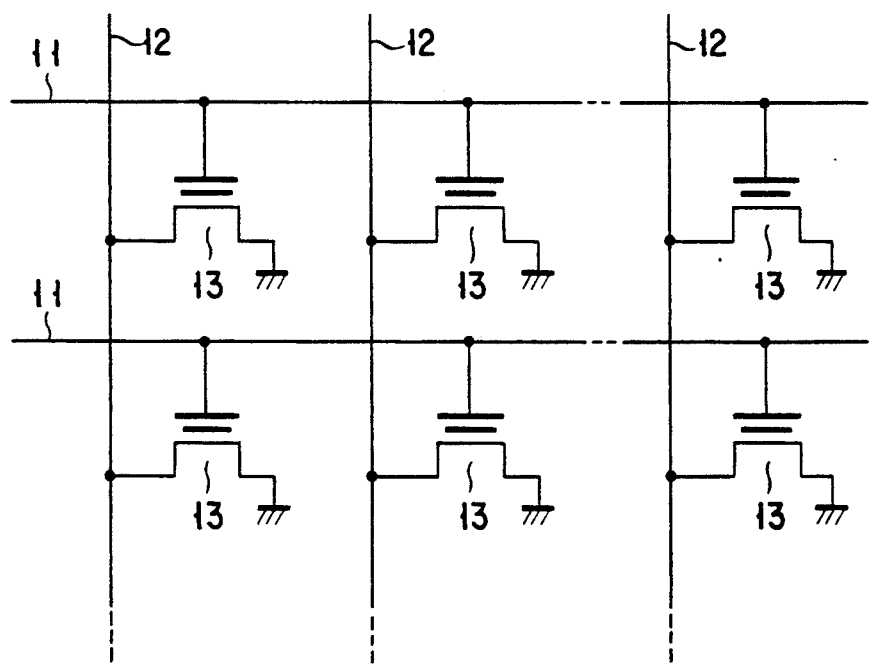
FIG. 9 is a circuit diagram showing a memory cell array of an EPROM manufactured by the method according to the above embodiment.

That is, in FIG. 9, reference numeral 11 denotes word lines, and reference numeral 12 denotes bit lines. Each of memory cells 13 is constituted by a MOS transistor having a two-layered gate structure which is further constituted by a floating gate and a control gate arranged at crossing points between the plurality of word lines 11 and the plurality of bit lines 12, respectively. Control gates of the memory cells 13 are connected to the corresponding word lines 11, and the drains of the memory cells 13 are connected to the corresponding bit lines 12. The sources of all the memory cells 13 are connected to the ground potential.

Figure 8A:
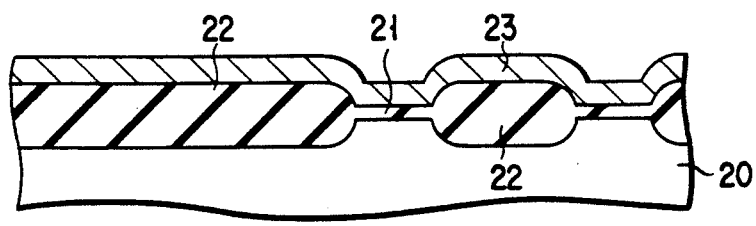
FIGS. 8A to 8E are sectional views showing sectional structures of the memory cell array along a line 8—8a in FIG. 7 in an order of manufacturing steps.
Figure 8B:
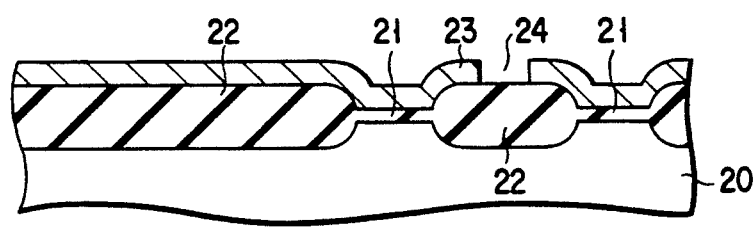
Figure 8C:
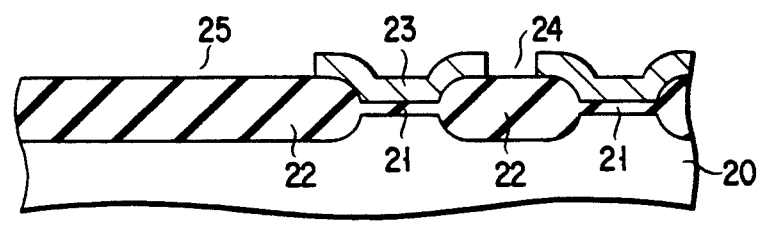
Figure 8D:
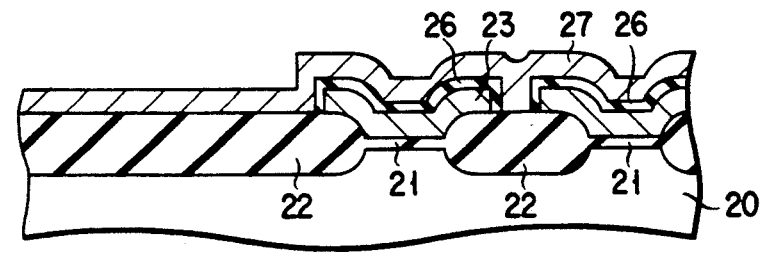
Figure 8E:
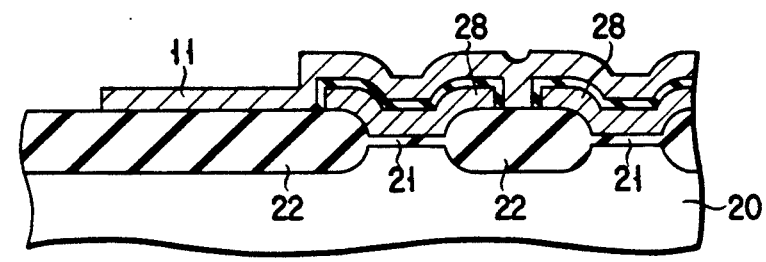

In this embodiment, an EPROM is manufactured as described below. As shown in FIG. 8A, a relatively thin gate oxide film 21 is formed in the element region of a semiconductor substrate 20, and a relatively thick field oxide film 22 is formed in a region other than the element region. A first polysilicon layer 23 is deposited on the entire surface of the resultant structure. As shown in FIG. 8B, the first polysilicon layer 23 is selectively anisotropically etched to form a cell slit 24 for separating floating gates (to be described later) from each other. As shown in FIG. 8C, the first polysilicon layer 23 is selectively anisotropically etched to form a removed region 25 of the first polysilicon layer 23 in a region in which a contact hole used for connecting a word line (to be described later) to the output node of a row decoder is prospectively formed. After the entire surface of the resultant structure is oxidized to form an oxide film 26, a second polysilicon layer 27 is deposited.

The second polysilicon layer 27, the oxide film 26, and the first polysilicon layer 23 in the cell region are selectively etched to form floating gates 28 of the memory cell transistors and the word lines 11 also serving as control gates of the memory cell transistors.

Thereafter, ion implantation is performed using the field oxide film 22 and the control gates 11 as masks to form the sources or drains of the memory cell transistors, thereby forming sources or drains 29 (shown in FIG. 7) of the memory cell transistors. In addition, contact holes 30 (shown in FIG. 7) for connecting bit lines are formed, and aluminum for forming the bit lines is deposited and patterned to form the bit lines (not shown).

In this embodiment, when each of the removed regions 25 is formed in the step of FIG. 8C, unlike in a conventional method, each of the removed regions 25 does not have a large region including the plurality of ends of the plurality of word lines. As shown in FIG. 7, the removed regions 25 are formed such that each of the removed regions 25 includes only an end of one of the word lines 11. The removed regions 25 are formed in the above manner, and then the second polysilicon layer 27 is formed on the entire surface of the resultant structure. This second polysilicon layer 27 is patterned to form the plurality of word lines 11. At this time, even when the second polysilicon layer 27 is not completely etched to be left on a side wall of the interface between the first polysilicon layer 23 and each of the removed regions 25, each of the removed regions 25 is not formed across two of the word lines 11, and a failure in which the word lines 11 are short-circuited with each other rarely occurs.

According to the method of this embodiment, a failure in which the word lines are short-circuited with each other can be considerably reduced.

In the method of this embodiment, although the cell slit 24 and the removed region 25 of the first polysilicon layer 23 are formed in different steps, respectively, they may be simultaneously formed.

Another embodiment of the present invention in which the present invention is applied to a method of manufacturing an EPROM will be described below.

Figure 10A:
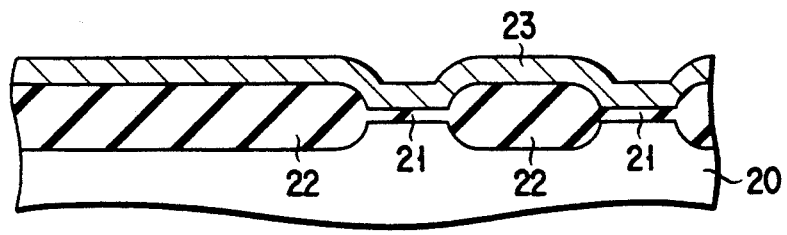
FIGS. 10A to 10E are sectional views sequentially showing the steps of a method according to another embodiment of the present invention.
Figure 10B:
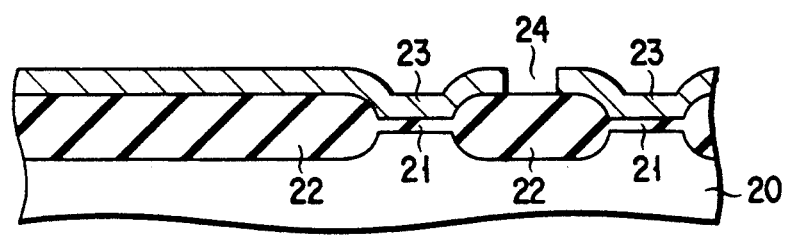

FIGS. 10A to 10E are sectional views showing the steps of a manufacturing method according to this embodiment. As shown in FIG. 10A, a relatively thin gate oxide film 21 is formed in an element region of a semiconductor substrate 20, and a relatively thick field oxide film 22 is formed in a region other than the element region. Subsequently, a first polysilicon layer 23 is deposited on the entire surface of the resultant structure. These steps are the same as those of the method of the embodiment shown in FIGS. 8A to 8E. A cell slit is formed, according to this embodiment, as shown in FIG. 11, such that an anisotropic etching method, e.g., an RIE (Reactive Ion Etching), is performed using an etching-resist mask having an opening portion (a portion which is not hatched) at a position corresponding to a cell slit. As shown in FIG. 10B, each of cell slits 24 is formed to have a substantially vertical wall.

Figure 12:
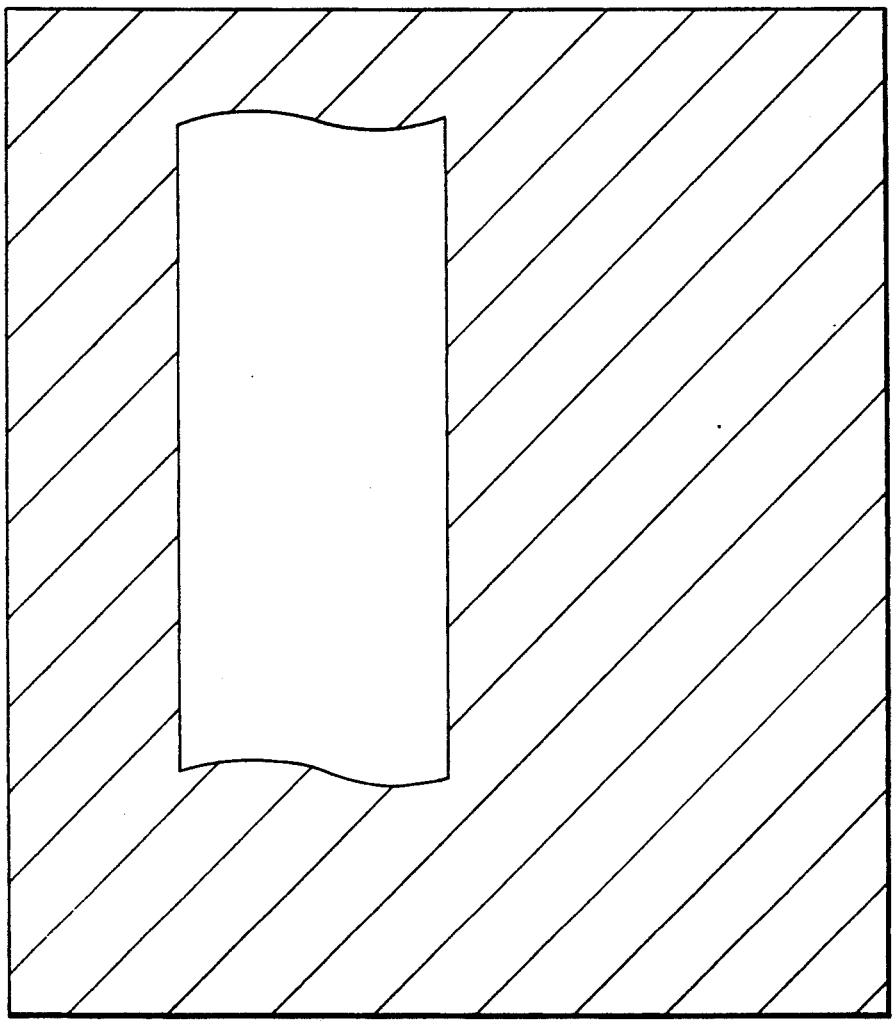
FIG. 12 is a view showing a mask used in the method of the embodiment in FIGS. 10A to 10E.

In this embodiment, a removed region is formed by performing an isotropic etching method, e.g., a CDE (Chemical Dry Etching) method, using an etching-resist mask having an opening portion (a portion which is not hatched) in a large region including a plurality of ends of a plurality of word lines, as shown in FIG. 12. Although a removed region 25 is formed by this etching method, the first polysilicon layer 23 is etched to cause the interface between the polysilicon layer 23 and the removed region 25 to have a trapezoidal shape. Thereafter, as in the above embodiment, as shown in FIG. 10D, the entire surface of the resultant structure is oxidized to form a gate oxide film 26, and a second polysilicon layer 27 is deposited. In addition, as shown in FIG. 10E, the second polysilicon layer 27, the gate oxide film 26, and the first polysilicon layer 23 in a cell region are selectively etched to form floating gates 28 of memory cell transistors and word lines 11 also serve as the control gates of the memory cell transistors.

Figure 10C:
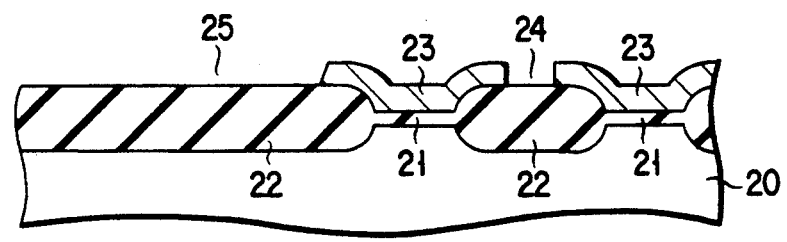
Figure 10D:
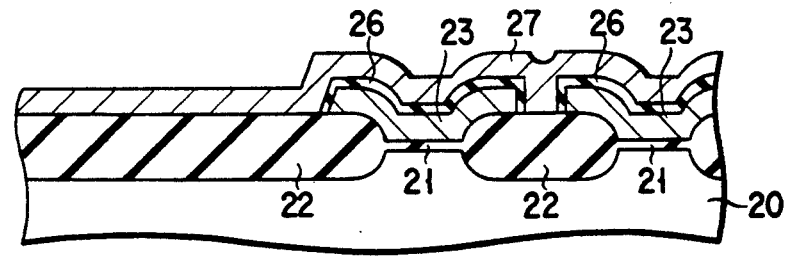
Figure 10E:
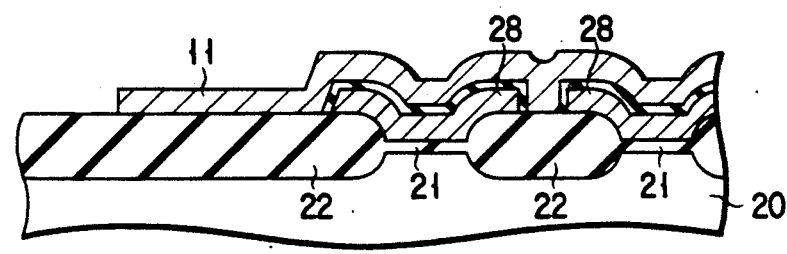
Figure 11:
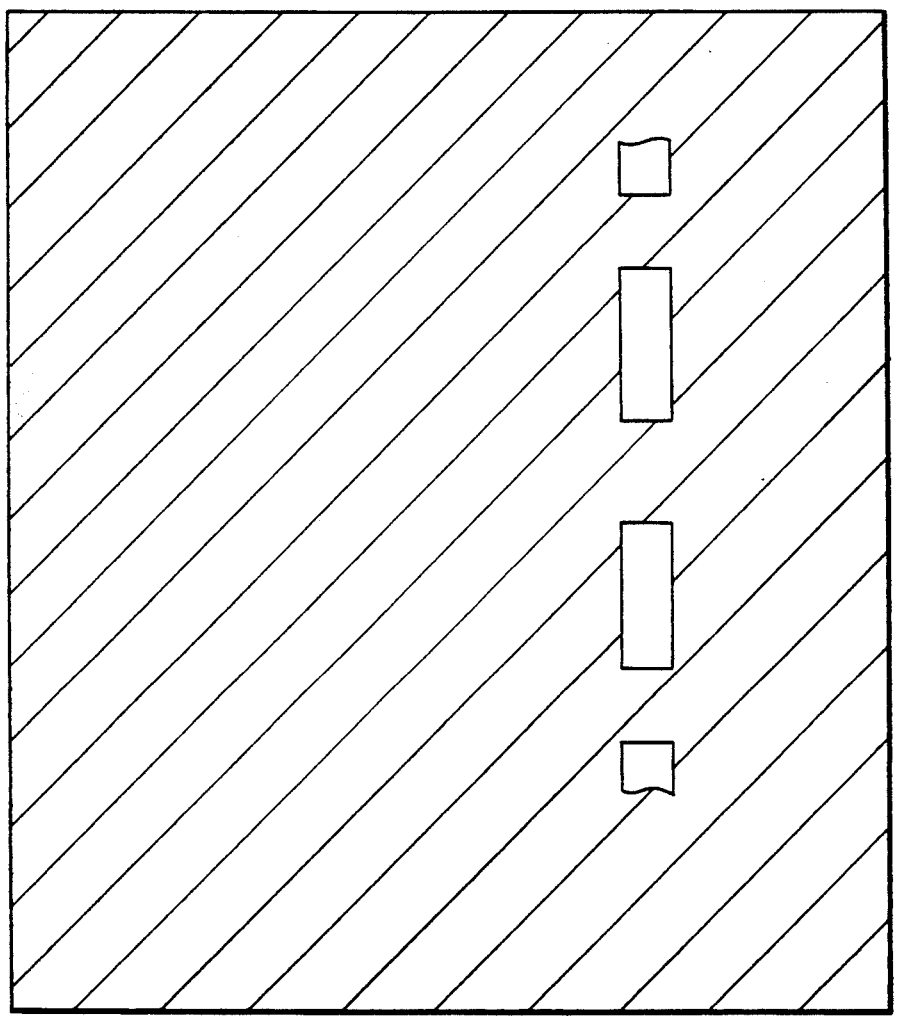
FIG. 11 is a view showing a mask used in the method of the embodiment in FIGS. 10A to 10E.

According to the method of this embodiment, when the removed region 25 is formed in the step of FIG. 10C, the first polysilicon layer 23 is etched to cause the interface between the polysilicon layer 23 and the removed region 25 to have a trapezoidal shape. For this reason, when the second polysilicon layer 27 is deposited and then selectively removed by etching, a target region of the second polysilicon layer 27 on the side wall of the gate oxide film 26 can be entirely removed.

According to this embodiment, the second polysilicon layer 27 on the side wall of the interface between the first polysilicon layer 23 and the removed region 25 is entirely etched and is not left, and the word lines 11 are rarely short-circuited with each other.

According to the method of the above embodiment, a failure in which word lines are short-circuited with each other can be considerably decreased.

Figure 1:
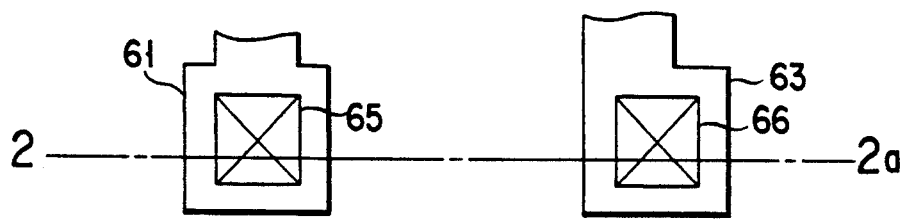
FIG. 1 is a plan view of a pattern showing a structure near the output node of a row decoder and one end of a word line.
Figure 2A:
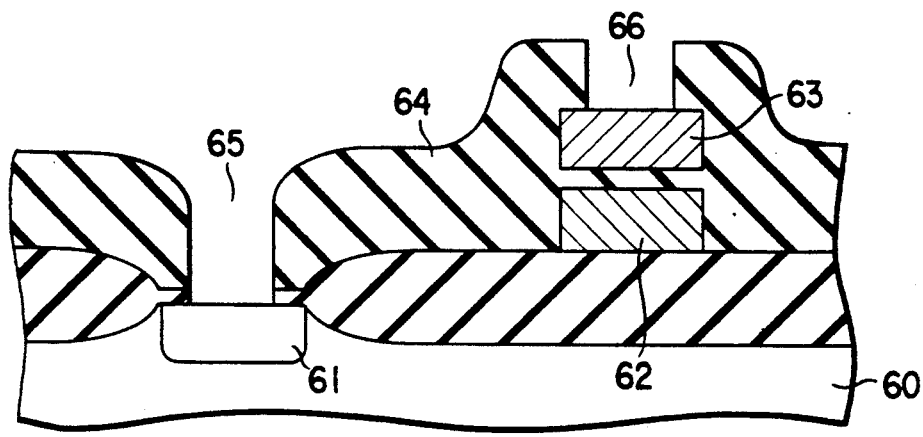
FIGS. 2A and 2B are sectional views of structures along a line 2—2a in FIG. 1.
Figure 2B:
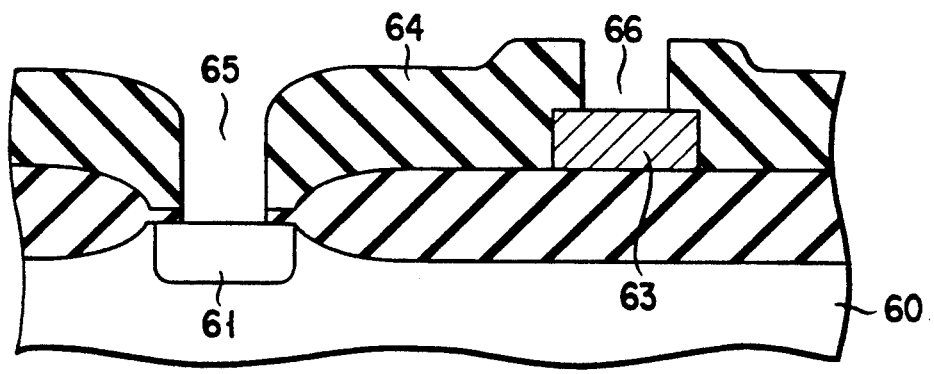
Figure 3:
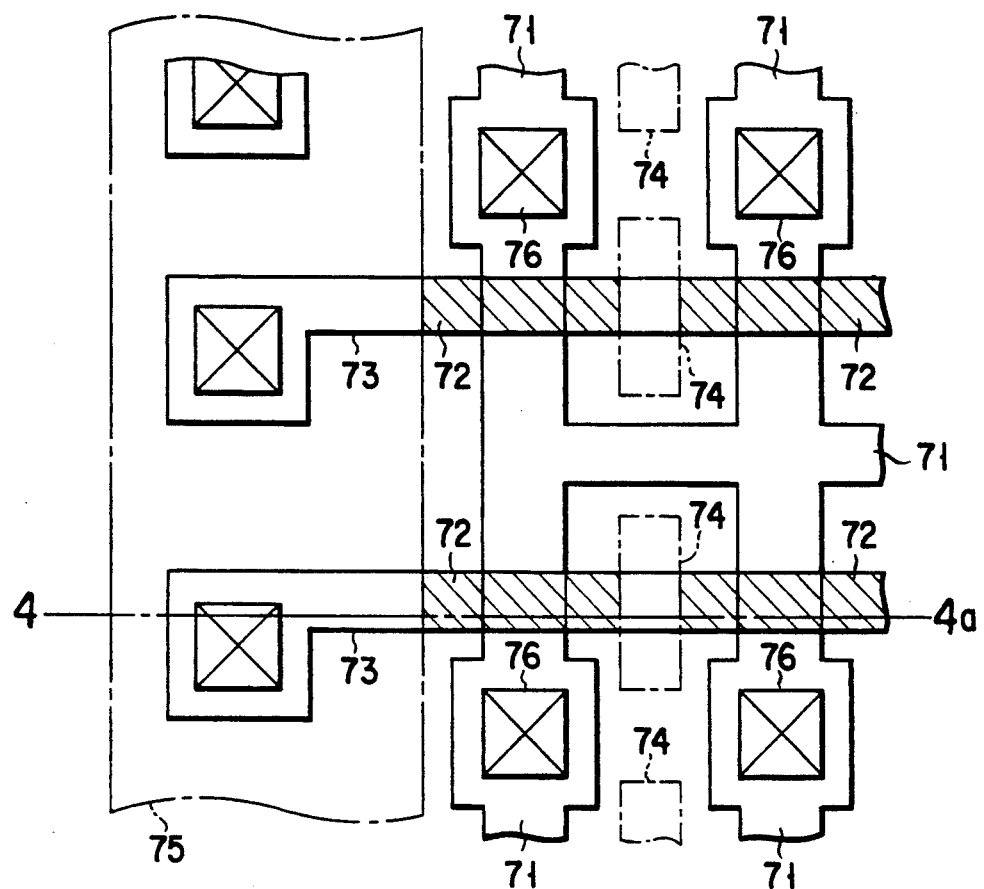
FIG. 3 is a plan view of a pattern showing an arrangement of a part of a memory cell array of an EPROM formed by a conventional method.
Figure 4:
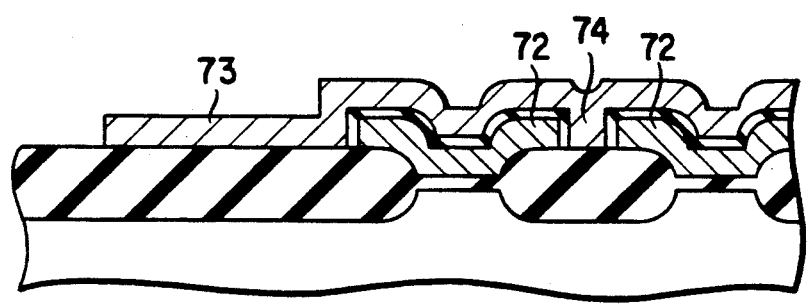
FIG. 4 is a sectional view showing the memory cell array along a line 4—4a in FIG. 3.
Figure 5A:
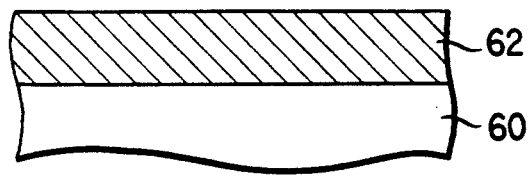
FIGS. 5A to 5E are sectional views sequentially showing the steps of a conventional method.
Figure 5B:
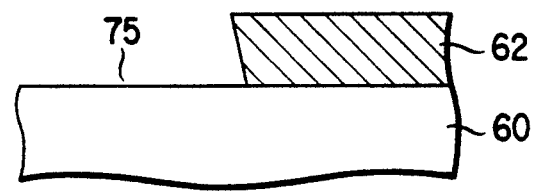
Figure 5C:
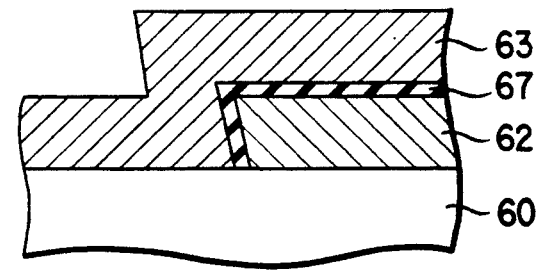
Figure 5D:
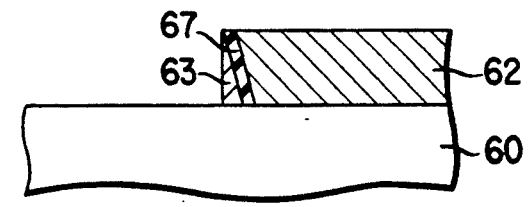
Figure 5E:
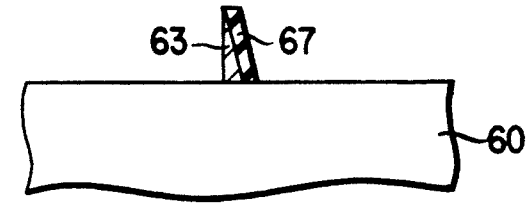
Figure 6:
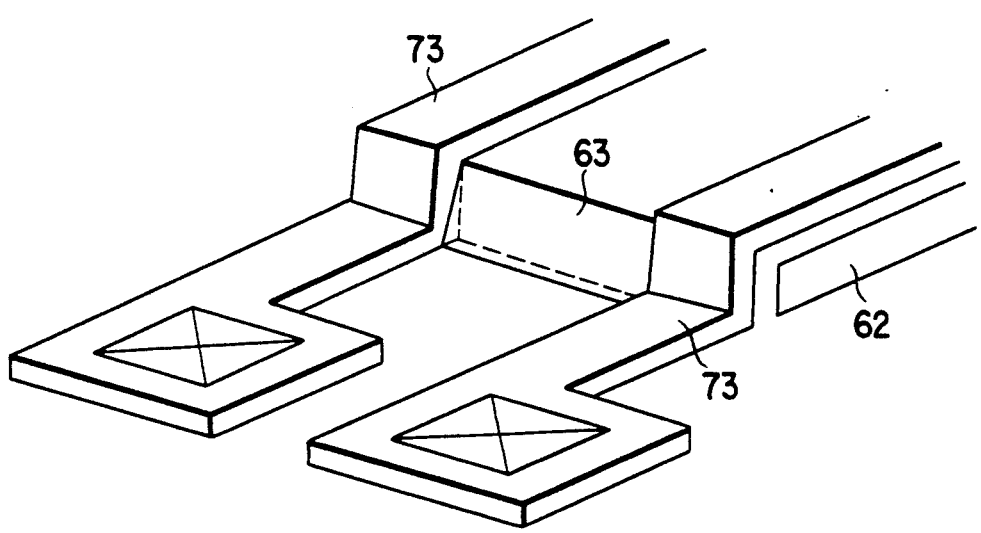
FIG. 6 is a perspective view showing the state at a time when the step of FIG. 5E is finished.
Figure 13:
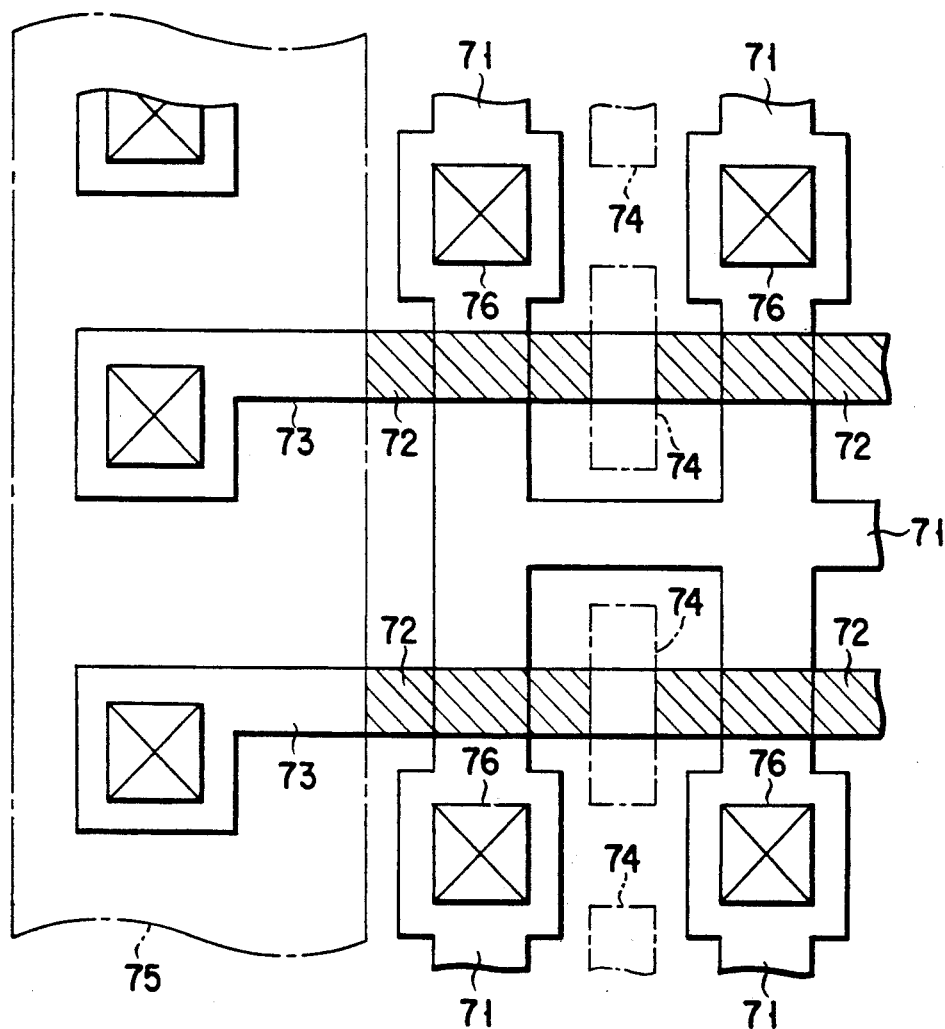
FIG. 13 is a plan view of a pattern showing a part of a memory cell array of an EPROM manufactured by a method of FIG. 7 of the present invention.

In this embodiment, the removed region 25 of the first polysilicon layer 23 is formed to have a large region including a plurality of ends of the plurality of word lines as shown in FIG. 1. However, as in the embodiment shown in FIGS. 7 and 8A to 8E, removed regions corresponding to word lines may be separately formed as shown in FIG. 13. The cell slits 24 may be formed by either of anisotropic etching and isotropic etching.

As described above, according to the present invention, there can be provided a method of manufacturing a semiconductor integrated circuit capable of preventing a failure in which second conductive layer regions to be formed separately from each other are short-circuited.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

We claim:

1. A manufacturing method of a semiconductor memory device, comprising the steps of:
    selectively forming a field oxide film and a first gate oxide film on a semiconductor substrate;
    depositing a first conductive layer on an entire surface of the field oxide film and the first gate oxide film;
    selectively etching said first conductive layer located in a region other than an element region;
    forming a second gate oxide film on the first conductive layer;
    depositing a second conductive layer on an entire surface of the first and second gate oxide films; and
    etching said first conductive layer and said second conductive layer using the same mask to form a plurality of floating gates by said first conductive layer and to form a plurality of control gates by said second conductive layer;
    wherein the step of selectively etching said first conductive layer includes a first etching step of removing cell slits for separating said plurality of floating gates from each other and a second etching step of forming removed regions each of which includes only one end of each of said plurality of control gates.

2. A manufacturing method according to claim 1, wherein the first and second etching steps are simultaneously performed.

3. A manufacturing method according to claim 1, wherein each of said removed regions each of which includes one end of each of said control gates includes a part or all of a contact region.

4. A manufacturing method of a semiconductor memory device, comprising the steps of:
    selectively forming a field oxide film and a first gate oxide film on a semiconductor substrate;
    depositing a first conductive layer on an entire surface of the field oxide film and the first gate oxide film,
    selectively etching said first conductive layer located in region other than an element region;
    forming a second gate oxide film on the first conductive layer;
    depositing a second conductive layer on an entire surface of the first and second gate oxide film; and
    etching said first conductive layer and said second conductive layer using the same mask to form a plurality of floating gates by said first conductive layer and to form a plurality of control gates by said second conductive layer;
    wherein the step of selectively etching said first conductive layer includes a first etching step of forming cell slits for separating said plurality of floating gates from each other and a second etching step of forming removed regions each of which includes only one end of each of said plurality of control gates, and the first and second etching steps are performed using etching methods different from each other.

5. A manufacturing method according to claim 4, wherein the first etching step is performed by an anisotropic etching method, and the second etching step is performed by an isotropic etching method.

6. A manufacturing method according to claim 4, wherein each of said removed regions each of which includes one end of each of said control gates includes a part or all of a contact region.

7. A manufacturing method of a semiconductor memory device, comprising the steps of:
    selectively forming a field oxide film and a first gate oxide film on a semiconductor substrate;

depositing a first conductive layer on an entire surface of the field oxide film and the first gate oxide film;

selectively etching said first conductive layer located in a region other than an element region;

forming a second gate oxide film on the first conductive layer;

depositing a second conductive layer on an entire surface of the first and second gate oxide films; and etching said first conductive layer and said second conductive layer using the same mask to form a plurality of floating gates by said first conductive layer and to form a plurality of control gates by said second conductive layer;

wherein the step of selectively etching said first conductive layer includes an anisotropic first etching step of forming cell slits for separating said plurality of floating gates from each other and an isotropic second etching step of forming removed regions each of which includes only one end of each of said plurality of control gates.

* * * * *